(12) United States Patent
Nakiboğlu et al.

(10) Patent No.: US 10,394,139 B2
(45) Date of Patent: Aug. 27, 2019

(54) PATTERNING DEVICE COOLING APPARATUS

(71) Applicants: ASML NETHERLANDS B.V., Veldhoven (NL); ASML HOLDING N.V., Veldhoven (NL)

(72) Inventors: Güneş Nakiboğlu, Eindhoven (NL); Lowell Lane Baker, Norwalk, CT (US); Ruud Hendrikus Martinus Johannes Bloks, Helmond (NL); Hakki Ergün Cekli, Singapore (SG); Geoffrey Alan Schultz, Shelton, CT (US); Laurentius Johannes Adrianus Van Bokhoven, Veldhoven (NL); Frank Johannes Jacobus Van Boxtel, Eindhoven (NL); Jean-Philippe Xavier Van Damme, Wezembeek-Oppem (BE); Christopher Charles Ward, Kensington, CA (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/090,713

(22) PCT Filed: Mar. 8, 2017

(86) PCT No.: PCT/EP2017/055407
§ 371 (c)(1),
(2) Date: Oct. 2, 2018

(87) PCT Pub. No.: WO2017/174284
PCT Pub. Date: Oct. 12, 2017

(65) Prior Publication Data
US 2019/0121248 A1    Apr. 25, 2019

Related U.S. Application Data

(60) Provisional application No. 62/318,098, filed on Apr. 4, 2016.

(51) Int. Cl.
*G03F 7/20* (2006.01)

(52) U.S. Cl.
CPC ................ *G03F 7/70875* (2013.01)

(58) Field of Classification Search
None
See application file for complete search history.

(56) References Cited

U.S. PATENT DOCUMENTS

| 6,654,660 | B1 | 11/2003 | Singh et al. |
| 2002/0045113 | A1 | 4/2002 | Pril et al. |

(Continued)

FOREIGN PATENT DOCUMENTS

| JP | H02132445 | 5/1990 |
| JP | H1022196 | 1/1998 |

(Continued)

OTHER PUBLICATIONS

International Search Report and Written Opinion issued in corresponding PCT Patent Application No. PCT/EP2017/055407, dated Jun. 20, 2017.

(Continued)

*Primary Examiner* — Michelle M Iacoletti
(74) *Attorney, Agent, or Firm* — Pillsbury Winthrop Shaw Pittman LLP

(57) ABSTRACT

A patterning apparatus for a lithographic apparatus, the patterning apparatus including a patterning device support structure configured to support a patterning device having a planar surface; a patterning device conditioning system including a first gas outlet configured to provide a first gas flow over the planar surface in use and a second gas outlet (Continued)

configured to provide a second gas flow over the planar surface in use, wherein the first gas outlet and the second gas outlet are arranged at different distances perpendicular to the planar surface; and a control system configured to independently control a first momentum of gas exiting the first gas outlet and a second momentum of gas exiting the second gas outlet or to independently vary the first gas flow and/or the second gas flow over the planar surface of the patterning device.

21 Claims, 6 Drawing Sheets

(56) References Cited

U.S. PATENT DOCUMENTS

| | | |
|---|---|---|
| 2002/0191163 A1 | 12/2002 | Hasegawa et al. |
| 2006/0087631 A1 | 4/2006 | Lallemant et al. |
| 2009/0207394 A1 | 8/2009 | Shibazaki |
| 2015/0241796 A1 | 8/2015 | Ebert, Jr. et al. |
| 2015/0301456 A1 | 10/2015 | Ebert, Jr. et al. |
| 2017/0363973 A1* | 12/2017 | Venturino ........... G03F 7/70875 |

FOREIGN PATENT DOCUMENTS

| | | |
|---|---|---|
| JP | H1126364 | 1/1999 |
| JP | 2011249620 | 12/2011 |
| WO | 2014067802 | 5/2014 |

OTHER PUBLICATIONS

"Vortex / Impingement Reticle Cooling Method", Research Disclosure, vol. 616, No. 1, Jun. 24, 2015.
Shiba, Y., et al.: "High Overlay Accuracy for Double Patterning Using an Immersion Scanner", Proc. of SPIE, vol. 8326, 2012, pp. 83260T-1-83260T-11.
Research Disclosure, vol. 584, No, 27, Nov. 1, 2012.

* cited by examiner

PATTERNING DEVICE COOLING APPARATUS

CROSS-REFERENCE TO RELATED APPLICATIONS

This application is the U.S. national phase entry of PCT patent application no. PCT/EP2017/055407, which was filed on Mar. 8, 2017, which claims the benefit of priority of U.S. patent application 62/318,098 which was filed on 4 Apr. 2016 and which is incorporated herein in its entirety by reference.

FIELD

The present disclosure relates to an apparatus and method for controlling the temperature of an object, for example, a patterning device in a lithographic apparatus, by flowing gas across a surface of the object.

BACKGROUND

A lithographic apparatus is a machine that applies a desired pattern onto a substrate, usually onto a target portion of the substrate. A lithographic apparatus can be used, for example, to manufacture integrated circuits (ICs). In such a case, a patterning device, for example, a mask or a reticle, can generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

SUMMARY

In the lithographic apparatus, the radiation beam may cause thermal effects (e.g., thermal expansion) in the patterning device. The patterning device may comprise a base material, for example, fused silica, that is substantially transparent to radiation of the radiation beam, for example, deep ultraviolet radiation, and may comprise a pattern made of a substantially non-transparent material, for example, chrome. The thermal effects may be due to absorption of the radiation of the radiation beam by non-transparent portions of the patterning device. Additionally, radiation from the radiation beam may also heat the gas around the support structure which may in turn heat the patterning device by convection heating leading to thermal effects. Thermal effects can alter the position of at least part of the patterning device and may cause, for example, alignment errors and/or overlay errors in the patterns formed on the substrate. To correct these errors due to thermal effects of the patterning device, a lithographic apparatus may rely on a correction system. For example, such a correction system can include a reticle or substrate alignment system, a magnification correction system, a feed forward system for expansion prediction, a lens correction system, or a combination thereof. However, with the continuing trend towards scaling down of device dimensions, these correction systems may not provide the desired level of alignment and/or overlay accuracy that may be needed for the development of these scaled down devices.

Accordingly, in some embodiments, there is provided a patterning apparatus and method that controls the temperature of a patterning device.

In some embodiments, there is provided a patterning apparatus for a lithographic apparatus, the patterning apparatus comprising: a patterning device support structure configured to support a patterning device having a planar surface; a patterning device conditioning system comprising a first gas outlet configured to provide a first gas flow over the planar surface in use and a second gas outlet configured to provide a second gas flow over the planar surface in use, wherein the first gas outlet and the second gas outlet are arranged at different distances perpendicular to the planar surface; and a control system configured to independently control a first momentum of gas exiting the first gas outlet and a second momentum of gas exiting the second gas outlet.

In some embodiments, there is provided a device manufacturing method using a lithographic apparatus, the method comprising: projecting a beam through a patterning device, wherein the beam is patterned by the patterning device; independently varying a first gas flow over a planar surface of the patterning device in use from a first gas outlet and/or a second gas flow over the planar surface of the patterning device in use from a second gas outlet, wherein the first gas outlet and the second gas outlet are at different distances perpendicular to the planar surface of the patterning device; and directing the beam onto a substrate.

Further features and advantages of the embodiments, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate embodiments of the invention and, together with the description, further serve to explain the principles of the embodiment and to enable a person skilled in the relevant art(s) to make and use the invention.

Figure 1A:
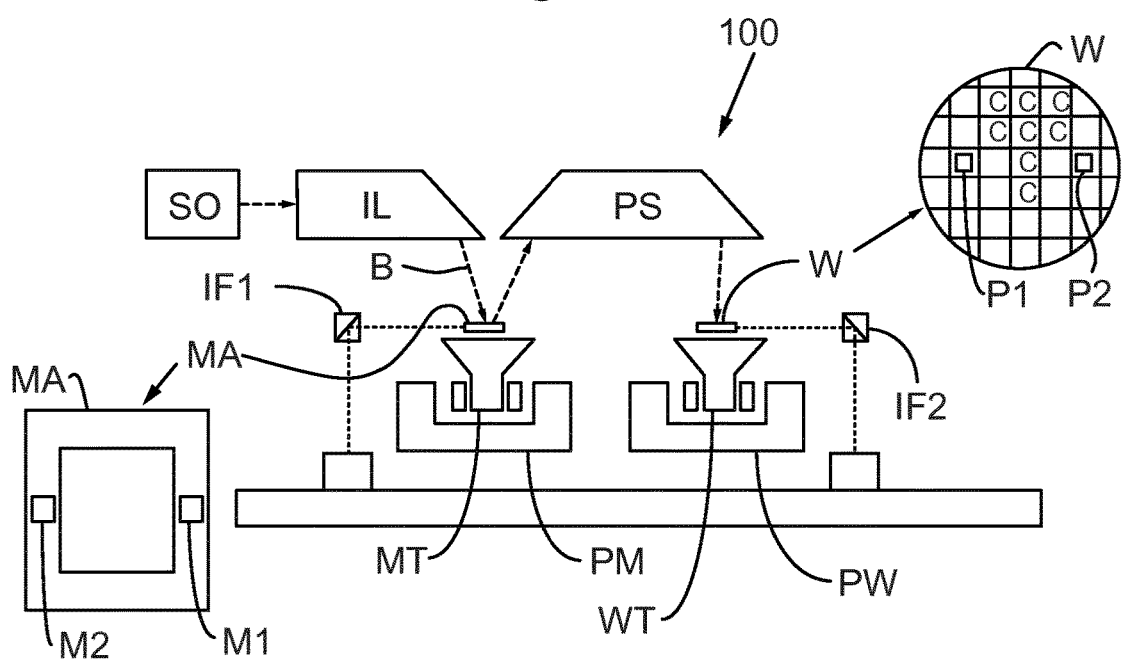
FIG. 1A is a schematic illustration of a reflective lithographic apparatus according to an embodiment.

The features and advantages of the disclosed embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Unless otherwise indicated, the drawings provided throughout the disclosure should not be interpreted as to-scale drawings.

DETAILED DESCRIPTION

Before describing such embodiments in more detail, however, it is instructive to present an example environment in which embodiments of this disclosure may be implemented.

Figure 1B:
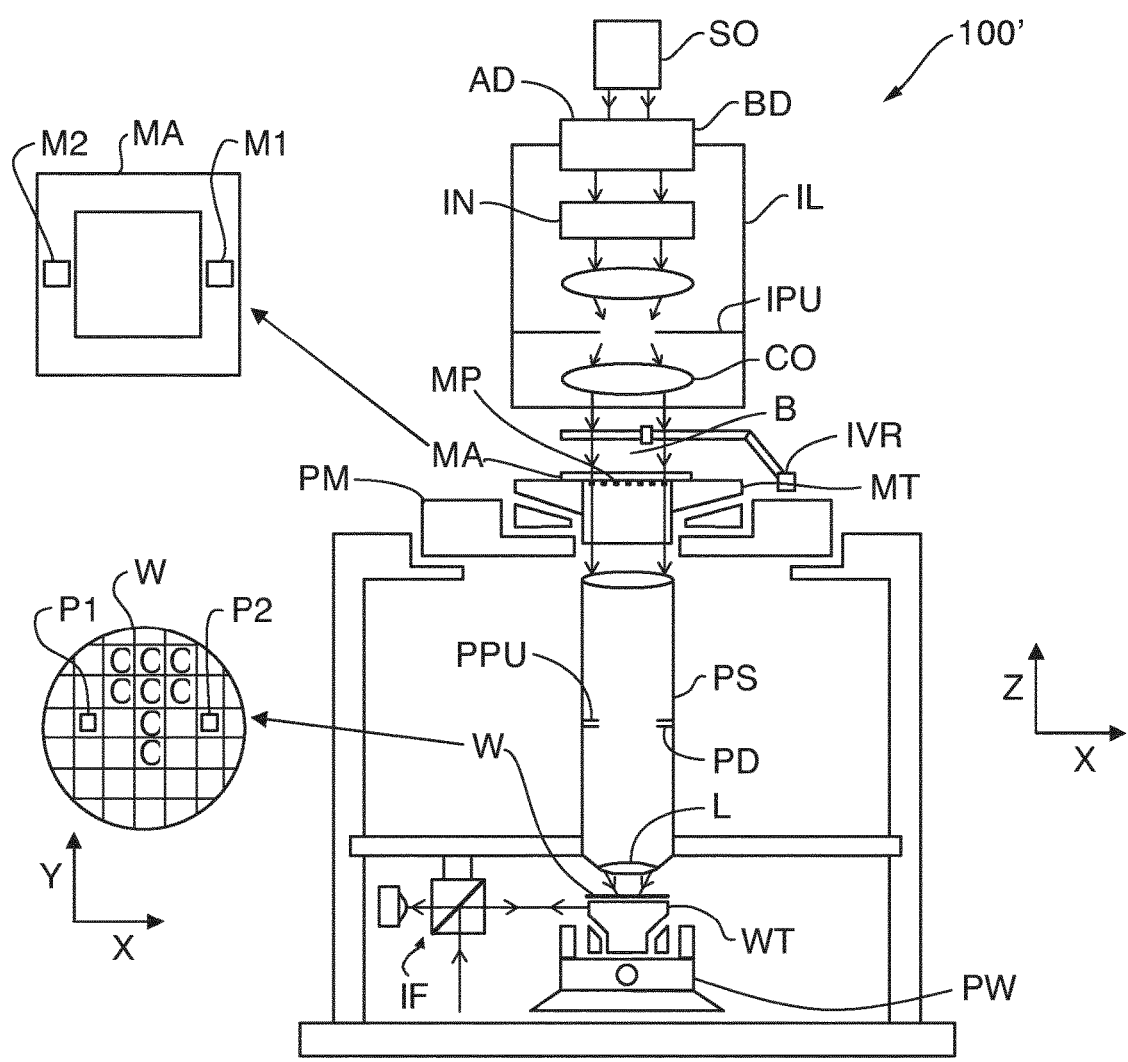
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of this disclosure may be implemented. Lithographic apparatus 100 and lithographic apparatus 100' each includes the following: an illuminator (illumination system) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising part of one or more dies) C of the substrate W. In lithographic apparatus 100, the patterning device MA and the projection system PS are reflective. In lithographic apparatus 100', the patterning device MA and the projection system PS are transmissive. In some embodiments, the projection system PS is catadioptric.

The illumination system IL may include various types of optical components, such as refractive, reflective, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam B in different directions. The tilted mirrors impart a pattern in the radiation beam B which is reflected by the minor matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two or more tables (or stage(s) or support(s)), e.g., two or more substrate tables (or patterning device tables) or a combination of one or more substrate tables and one or more sensor or measurement tables configured to measure properties of the projection system PS and not configured to hold a substrate W. In such "multiple stage" machines, the additional substrate tables WT can be used in parallel, or preparatory steps can be carried out on one or more tables while one or more other substrate tables WT are being used for exposure.

Referring to FIGS. 1A and 1B, the illuminator IL receives a radiation beam B from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing minors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) configured to adjust the angular intensity distribution of the radiation beam B. Generally, at least the outer and/or inner radial extent (commonly referred to as "σ-outer" and "σ-inner," respectively) of the intensity distribution in a pupil planar of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section. Similar to the source SO, the illuminator IL may or may not be considered to form part of the lithographic apparatus 100, 100'. For example, the illuminator IL may be an integral part of the lithographic apparatus 100, 100' or may be a separate entity from the lithographic apparatus 100, 100'. In the latter case, the lithographic apparatus 100, 100' may be configured to allow the illuminator IL to be mounted thereon. Optionally, the illuminator IL is detachable and may be separately provided (for example, by the lithographic apparatus manufacturer or another supplier).

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using patterning device alignment marks M1, M2 and substrate alignment marks P1, P2.

Referring to FIG. 1B, the radiation beam B is incident on the patterning device MA (for example, mask), which is held on the support structure MT (for example, mask table), and is patterned by the patterning device MA. Having traversed the mask, the radiation beam B passes through the projection system PS, which focuses the beam onto a target portion C of the substrate W. The projection system PS has a pupil PPU conjugate to an illumination system pupil IPU. Portions of radiation emanate from the intensity distribution at the illumination system pupil IPU and traverse a patterning device pattern without being affected by diffraction at a patterning device pattern to create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the patterning device (for example, mask) MA with respect to the path of the radiation beam B (for example, after mechanical retrieval from a mask library or during a scan).

In general, movement of the support structure (for example, mask table) MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the support structure (for example, mask table) MT can be connected to a short-stroke actuator only or can be fixed. Patterning device (for example, mask) MA and substrate W can be aligned using mask alignment marks M1, M2, and substrate alignment marks P1, P2. Although the substrate alignment marks P1, P2 (as illustrated) occupy dedicated target portions C, they can be located in spaces between target portions (known as scribe-lane alignment marks). Similarly, in situations in which more than one die is provided on the patterning device (for example, mask) MA, the mask alignment marks M1, M2 can be located between the dies.

Support structure (for example, mask table) MT and patterning device MA can be in a vacuum chamber, where an in-vacuum robot IVR can be used to move patterning devices MA, such as masks, in and out of vacuum chamber. Alternatively, when support structure (for example, mask table) MT and patterning device MA are outside of the vacuum chamber, an out-of-vacuum robot can be used for various transportation operation, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operational can be readily applied to maskless lithography that utilizes a programmable patterning device, such as a programmable minor array of a type as referred to herein.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

A patterning apparatus may provide a gas flow over a surface of a patterning device to alter or control the temperature of the patterning device in some way to reduce errors induced by thermal variation of the patterning device. Such a patterning apparatus may control the gas flow to control and reduce the effects of thermal variation. However, such an apparatus may not adequately reduce errors induced by thermal variation of the patterning device. In particular, thermal variation of the patterning device may be non-uniform. This leads to temperature gradients of the patterning device. Although the temperature gradients may appear small, the overlay error induced may be considerable. Prior systems may focus on reducing temperature of the patterning device, but may not control the temperature to reduce temperature gradients adequately. Therefore, more specific control may be required than is currently available to account for thermal variation on the surface of the patterning device. In an embodiment, there is provided a patterning apparatus and a method configured to control temperature of the patterning device to improve uniformity of the temperature of the patterning device. Thus, in an embodiment, there is provided a patterning apparatus and a method that may provide a more uniform temperature across the patterning device and may also reduce the temperature across the patterning device. In an embodiment, there is provided a patterning apparatus comprising a conditioning system with gas outlets as described below.

Figure 2:
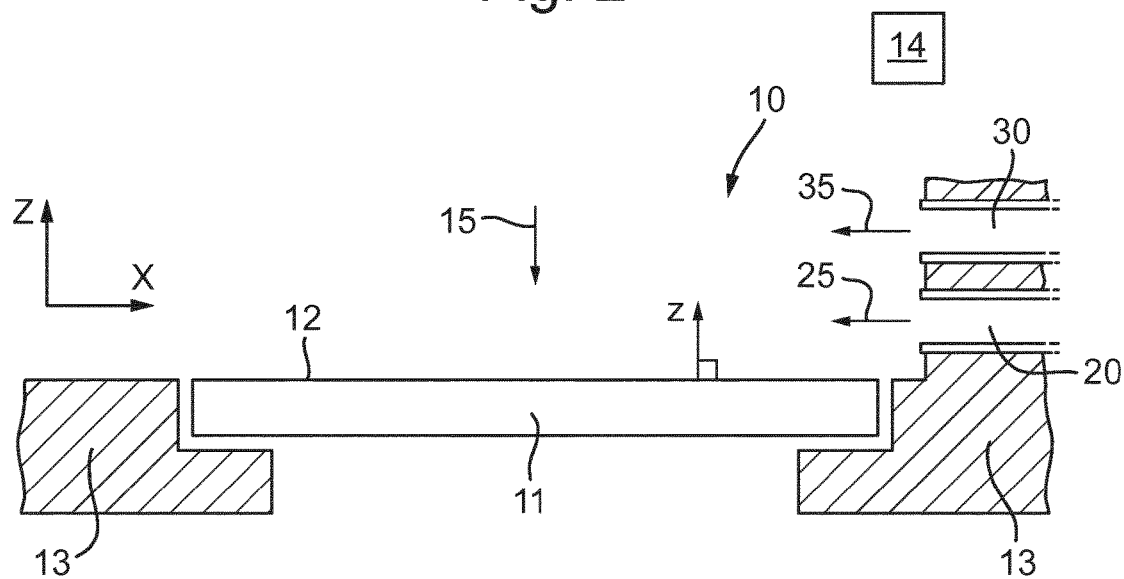
FIG. 2 is a schematic side view illustration of a patterning apparatus according to an embodiment.

FIG. 2 is a schematic side view of a patterning apparatus 10, comprising a patterning device support structure 13 configured to support a patterning device 11. The patterning device support structure 13 may be the same as the support structure MT (for example, the mask table) as described in relation to FIGS. 1A and 1B, and is referred to as the support structure 13 from hereon in. The support structure 13 is configured to support the patterning device 11. The patterning device 11 may be the same as the patterning device MA (for example, a mask, a reticle or a dynamic patterning device, etc.) as described in relation to FIGS. 1A and 1B. A radiation beam 15 may be directed to the patterning device 11, such that the patterning device 11 can be used to impart a pattern to the radiation beam 15. The radiation beam 15 may be the same as the radiation beam B (for example, DUV or EUV radiation) as described in relation to FIG. 1A or 1B. Generally the radiation beam 15 is reflected from, or passes through, the patterning device 11. Thus, the radiation beam 15 is generally instant on a surface of the patterning device 11. The radiation beam 15 and/or temperature variation of the patterning device 11 may heat the gas around the patterning device 11. Thus, a temperature variation may be introduced to the patterning device 11.

The surface of the patterning device 11 may be a planar surface 12, and the planar surface 12 may be heated by the radiation beam 15. The planar surface 12 may be substantially flat. However, the planar surface 12 may not be flat, and the planar surface 12 may be a plane used for reference. For example, the planar surface 12 may be a plane at the top of the surface of the patterning device 11, for example, a plane in which the highest points of the patterning device 11 are located.

The support structure 13 may use mechanical, vacuum, electrostatic, or other clamping techniques to hold the patterning device 11 in place, and/or optionally to hold the patterning device 11 to a support table (not shown in FIG. 2) that directly supports the patterning device 11 on the support structure 13. The support structure 13 may be configured to ensure that the patterning device 11 is at a specific position, for example, with respect to other components outside of the patterning apparatus 10. For example, the support structure 13 can include a moveable component such as a short and/or long stroke module, described above, which are configured accurately to position the patterning device 11 (e.g. along the X-axis and/or the Y-axis depicted in FIG. 3). The support structure 13 can be any appropriate shape to support the patterning device 11 and may have an opening beneath the patterning device 11 as shown in the Figures, or may be solid beneath the patterning device 11 (not shown).

The patterning apparatus 10 further comprises a patterning device conditioning system, which is referred to as the conditioning system from hereon in. The conditioning system comprises a first gas outlet 20 and a second gas outlet 30, for example, as depicted from a side view in FIG. 2. The first gas outlet 20 is configured to provide a first gas flow 25 over the planar surface 12 of the patterning device 11 when in use. The second gas outlet 30 is configured to provide a second gas flow 35 over the planar surface 12 of the patterning device 11 when in use. In other words, both the first gas flow 25 and the second gas flow 35 are provided over the same surface of the patterning device 11. The first gas outlet 20 may comprise multiple gas outlets, for example, across the width of the patterning device 11. That is, the first gas outlet 20 depicted across the side of the patterning device 11 in FIG. 3 may comprise multiple, individual gas outlets. Similarly, the second gas outlet 30 may comprise multiple gas outlets, for example, across the width of the patterning device 11.

As described above, as the radiation beam 15 is directed to the patterning device 11, it leads to thermal variation of the patterning device 11 on which the radiation beam 15 is incident. In known systems, a gas flow may be provided over the planar surface 12 of the patterning device 11, generally to reduce the temperature of the patterning device 11 and thus to reduce or avoid errors as a result of this thermal variation. However, in many cases, this temperature control is not adequate to reduce these errors to an acceptable degree. This is partly because the cooling effect of the flow over the surface of the patterning device decreases downstream of the location where the gas is provided. There may be various reasons for this, but this may be due to the development of a boundary layer over the planar surface 12 of the patterning device 11 and also due to heating of the flow.

In general, it is more efficient to cool the surface of a patterning device 11 using a turbulent flow because the turbulent mixing of the flow mixes the hotter gas in the gas flow with cooler gas which helps remove heat from the surface of the patterning device 11. However, as gas flows along the planar surface 12 of the patterning device 11, a boundary layer forms along the surface, and the boundary layer may be laminar. The laminar boundary layer is not as effective at transmitting heat from the planar surface 12 of the patterning device 11 as the turbulent flow. Thus, the gas emitted by the conditioning system is often more efficient towards the start of the flow, i.e. near the exit from the outlets, because no boundary layer has yet formed and therefore, better mixing may occur. As the boundary layer develops downstream, mixing of gas in a direction perpendicular to the planar surface 12 of the patterning device 11 is reduced. Thus, the formation of a boundary layer on the planar surface 12 of the patterning device 11 reduces efficiency of the conditioning system.

Furthermore, the gas of the first gas flow 25 and the second gas flow 35 will be heated as it passes over the planar surface 12 of the patterning device 11 i.e. as it travels downstream. The gas may be heated by the patterning device 11 or by radiation from the radiation beam 15. The gas may heat up quickly and temperature differences between the planar surface 12 of the patterning device 11 and the surrounding gas (i.e. the gas of the first gas flow 25 and the gas of the second gas flow 35) may be reduced. The temperature difference may be further reduced as the gas flow travels downstream. The reduced temperature difference leads to less efficient cooling.

In an embodiment, the first gas outlet 20 and the second gas outlet 30 are arranged at different distances perpendicular to the planar surface 12. As depicted in FIG. 2, the second gas outlet 30 is arranged at a greater distance than the first gas outlet 20 from the planar surface 12 of the patterning device 11. In FIG. 2, the distance from the planar surface 12 of the patterning device 11 is depicted by the arrow in the Z direction.

The patterning apparatus 10 further comprises a control system 14 configured to control separately at least one parameter of the gas exiting the first gas outlet 20 and/or the gas exiting the second gas outlet 30. In other words, at least one parameter of the gas exiting the first gas outlet 20 and/or the gas exiting the second gas outlet 30 is individually controlled. Thus, the control system 14 controls the first gas outlets 20 and the second gas outlet 30 independently. The control system 14 is configured to control a first momentum of gas exiting the first gas outlet 20 and is configured to independently control a second momentum of gas exiting the second gas outlet 30. In this way, the control system 14 may provide gas from each of the first gas outlet 20 and the second gas outlet 30 having different or the same momentum as each other. For example, the control system 14 may alter the amount of gas and/or the speed of gas provided to the first gas outlet 20 and/or to the second gas outlet 30 to alter the first momentum and/or the second momentum respectively. The control system 14 may be configured to control additional parameters of gas exiting the first gas outlet 20 and/or the second gas outlet 30, for example temperature and/or gas humidity.

Providing a conditioning system comprising the first gas outlet 20 and the second gas outlet 30 which are arranged at different distances perpendicular to the planar surface 12 of the patterning device 11 allows the flow of gas over the planar surface 12 of the patterning device 11 to be more advantageously controlled. Having multiple outlets (i.e. a first gas outlet 20 and a second gas outlet 30) allows separate control of the gas outlets in order to alter the downstream characteristics of the gas flow over the surface of the patterning device 11. Thus, providing a first gas outlet 20 at a first height and a second gas outlet 30 at a second height (i.e. at different distances perpendicular to the planar surface 12) is beneficial because it can reduce development of the boundary layer described above and may help reduce heating of the cooling flow.

Providing a first gas outlet 20 and a second gas outlet 30 which can be individually controlled allows the first gas flow 25 exiting the first gas outlet 20 and the second gas flow 35 exiting the second gas outlet 30 to be controlled independently, optionally, at different values. The first gas flow 25 and the second gas flow 35 may be independently optimized. Controlling the momentum of gas exiting each of the first gas outlet 20 and the second gas outlet 30 allows the temperature variation over the patterning device 11 to be controlled more accurately to account for thermal variation of the patterning apparatus 10 to reduce thermal variation.

It will be understood that the terminology relating to the first, the second and so on is interchangeable and is used merely to identify which gas outlet is being referred to.

The first gas flow 25 and/or the second gas flow 35 may be substantially dehumidified gas. The first gas flow 25 and/or the second gas flow 35 may comprise extremely clean gas or air, or may consist essentially of, extremely clean gas or air. The first gas flow 25 and/or the second gas flow 35 may comprise, or may consist essentially of, extremely clean dry air (i.e. filtered and dehumidified air sometimes referred to as XCDA). The first gas flow 25 and/or the second gas flow 35 may comprise carbon dioxide, helium, argon, nitrogen and/or hydrogen. The first gas flow 25 and/or the second gas flow 35 may comprise or be a combination of at least one of these gases. The first gas flow 25 and/or the second gas flow 35 may be temporarily or selectively stopped while the patterning device 11 is loaded or unloaded from the support structure 13 to avoid disturbing the loading process. In some embodiments the first gas flow 25 and/or the second gas flow 35 can be temporarily and selectively stopped when no cooling of the patterning device 11 is required.

Figure 3:
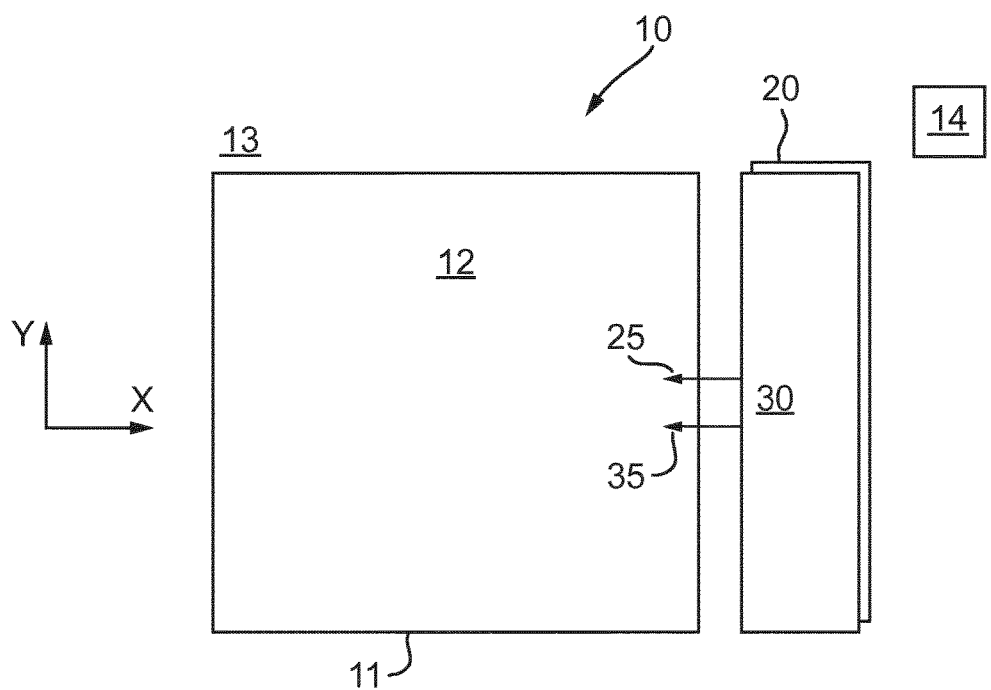
FIG. 3 is a schematic plan view illustration of the patterning apparatus depicted in FIG. 2.

As depicted in FIG. 2, the first gas outlet 20 is positioned and configured to generate the first gas flow 25 that travels across the planar surface 12 of the patterning device 11. The second gas outlet 30 is positioned and configured to generate a second gas flow 35 that also travels across the planar surface 12 of the patterning device 11. In other words, the first gas outlet 20 and the second gas outlet 30 provide gas to the same surface of the patterning device 11. FIG. 3 shows the patterning apparatus 10 of FIG. 2 in plan view. The first gas outlet 20 and the second gas outlet 30 are shown to be slightly misaligned in FIG. 3, however, these outlets may be the same size and aligned (i.e. one effectively on top of each other) or the different outlets may not be aligned and/or be different sizes.

If the conditioning system comprises multiple first gas outlets 20, the multiple first gas outlets 20 may be controlled independently or together. It is not necessary to control each of the individual first gas outlets 20 separately e.g. the first gas outlets 20 may comprise multiple, connected openings. If the conditioning system comprises multiple second gas outlets 30, the multiple second gas outlets 30 may be controlled independently or together. It is not necessary to control each of the individual second gas outlets 30 separately e.g. the second gas outlets 30 may comprise multiple, connected openings.

In an embodiment, the control system 14 is configured to control the first gas flow 25 at a different momentum from the second gas flow 35. The skilled person would understand that control of the momentum could be interchangeable with control of the gas flow rate. Although the gas flow rate and momentum are different features of the flow, they may be used interchangeably by the patterning apparatus 10 as characteristics which can be measured and controlled by the control system 14 in order to provide flow over the patterning device 11 as described above.

As described, the thermal variation across the patterning device 11 may not be uniform. Non-uniformity can occur downstream in the first gas flow 25 and the second gas flow 35. For example, as depicted in FIGS. 2 and 3, there may be variation of the temperature of the planar surface 12 of the patterning device 11 along the X direction. Using the control system 14 to independently control the first momentum of gas exiting the first gas outlet 20 and the second momentum of gas exiting the second gas outlet 30 allows for the conditioning system to account for this non-uniformity. Furthermore, having the first gas flow 25 at a different momentum from the second gas flow 35 provides further control and variation in order to reduce the non-uniformity.

As depicted in FIGS. 2 and 3, the first gas outlet 20 and the second gas outlet 30 may be located on the same side of the patterning device 11 in plan view. In other words, the first gas outlet 20 and the second gas outlet 30 may be located along the same edge of the patterning device 11 in use. Gas from the first gas outlet 20 and the second gas outlet 30 may be provided over the planar surface 12 of the patterning device 11 may be provided from a similar direction when viewed in plan. There is an advantage to having the first gas outlet 20 and the second gas outlet 30 along the same side of the patterning device 11 (in plan view) because components required to provide the outlets and provide gas to the outlets only have to be located on one side, rather than having to be provided on the other side of the patterning device 11 (in plan view) also.

Although the location of the first gas outlet 20 and the second gas outlet 30 is described in relation to the patterning device 11, it is understood, that this is in use and the apparatus can be configured in the ways described whether or not a patterning device 11 is present. Thus when the patterning apparatus 10 is used to support a patterning device 11, e.g. when in use, the configuration of the patterning apparatus 10 is as described throughout the description.

In an embodiment, the control system 14 may control the gas exiting the first gas outlet 20 and the second gas outlet 30 to occur at the same time, i.e. so that the first gas flow 25 and the second gas flow 35 occur simultaneously. In other words, the first gas flow 25 exiting the first gas outlet 20 may be provided at the same time as the second gas flow 35 is provided by the second gas outlet 30.

Using both the first gas outlet 20 and the second gas outlet 30 simultaneously and having the first gas outlet 20 at a different perpendicular distance to the planar surface 12 than the second gas outlet 30 can be advantageous. As described, the momentum of gas from the first outlet 20 and the second outlet 30 may be controlled. Thus, providing gas from the first gas outlet 20 and the second gas outlet 30 at the same time provides additional tuning capability because the first gas flow 25 and the second gas flow 35 may interact with each other. For example, the first momentum and the angle of the first flow 25 and the second momentum and the angle of the second flow 35 may be selected such that a jet is created using the second gas flow 35, and the first gas flow 25 is then entrained into the jet. When such a jet flow is generated a shear layer is created, due to the velocity difference between the jet flow and the surrounding fluid. The shear layer is very unstable and leads to reduction of the jet velocity downstream. However, the shear layer will be decreased by providing gas from the first gas outlet 25 at the same time because of gas from the first gas flow 25 will be entrained in the jet and the velocity difference between the jet flow and the first gas flow 25 will be smaller than the difference between the jet and other surrounding fluid. Therefore, the jet flow may have a higher momentum to reach further downstream. Furthermore, gas is entrained from the first gas flow 25, rather than from gas surrounding the patterning apparatus 10, thus, using the first gas outlet 20 and the second gas outlet 30 in this way means that there is less mixing of gas external to the gas provided by the conditioning system on the patterning device 11. This provides a further control, because it reduces or prevents gas other than the first gas flow 25 and the second gas flow 35 being used on the planar surface 12 of the patterning device 11 which can provide more efficient control of the temperature of the patterning device 11.

Alternatively, the conditioning system may be configured to use one or other of the first gas outlet 20 and/or the second gas outlet 30 asynchronously. In other words, the control system 14 may control gas exiting the first gas outlet 20 and the second gas outlet 30 such that gas is provided from the first gas outlet 20 or the second gas outlet 30 at different times from each other, i.e. only the first gas flow 25 or the second gas flow 35 passes over the patterning device 11 at any one time. Providing this level of control allows non-uniformities to be reduced as described above, because the patterning apparatus 10 can alter the gas flows over the patterning device 11 to exit from the first gas outlet 20, the second gas outlet 30, or both as required.

The shape of the first gas outlet 20 and the second gas outlet 30 may be the same as each other. Alternatively, the shape of the first gas outlet 20 may be different from the second gas outlet 30. The shape of each of the first gas outlet 20 and the second gas outlet 30 may be selected depending on the type of flow desired from the outlet. This may depend on the location of the outlet in the z direction i.e. the perpendicular distance from the planar surface 12. The shape of the openings of the first gas outlet 20 and/or the second gas outlet 30 may be separately optimized. Furthermore, the first gas outlet 20 and/or the second gas outlet 30 may have variable shaped openings. The cross-sectional area (i.e. the openings) of each of the outlets may be variable to change characteristics of the gas flow leaving the respective openings. The control system 14 may be configured to control the cross-sectional area of the first gas outlet 20 and/or the second gas outlet 30 to alter the momentum of the first gas flow 25 and/or the momentum of the second gas flow 35 respectively.

Although the first gas flow 25 and the second gas flow 35 are each depicted as individual arrows in the figures, the width of the first gas flow 25 and the second gas flow 35 will be determined by each of the gas outlets, e.g. the first gas outlet 20 and the second gas outlet 30 respectively. This applies to any additional gas flows provided from any additional gas outlets. The width of the first gas flow 25 and/or the second gas flow 35 as it travels across the patterning device 11 may be at substantially the same width as when it exits the first gas outlet 20 and/or the second gas outlet 30 respectively.

The first gas flow 25 may have substantially the same width as the first gas outlet 20. For example in the patterning apparatus 10 as depicted in FIG. 3, the first gas flow 25 exiting the first gas outlet 20 may have a width substantially the same as the first gas outlet 20. Thus, the first gas flow 25 may have a width substantially the same as the width of the patterning device 11, as shown in FIG. 3. Similarly, the second gas flow 35 may have substantially the same width as the second gas outlet 30. For example, in the patterning apparatus 10 depicted in FIG. 3, the second gas flow 35 exiting the second gas outlet 30 may have a width substantially the same as the second gas outlet 30. Thus the second gas flow 35 may have a width substantially the same as the width of the patterning device 11, as shown in FIG. 3.

Figure 4:
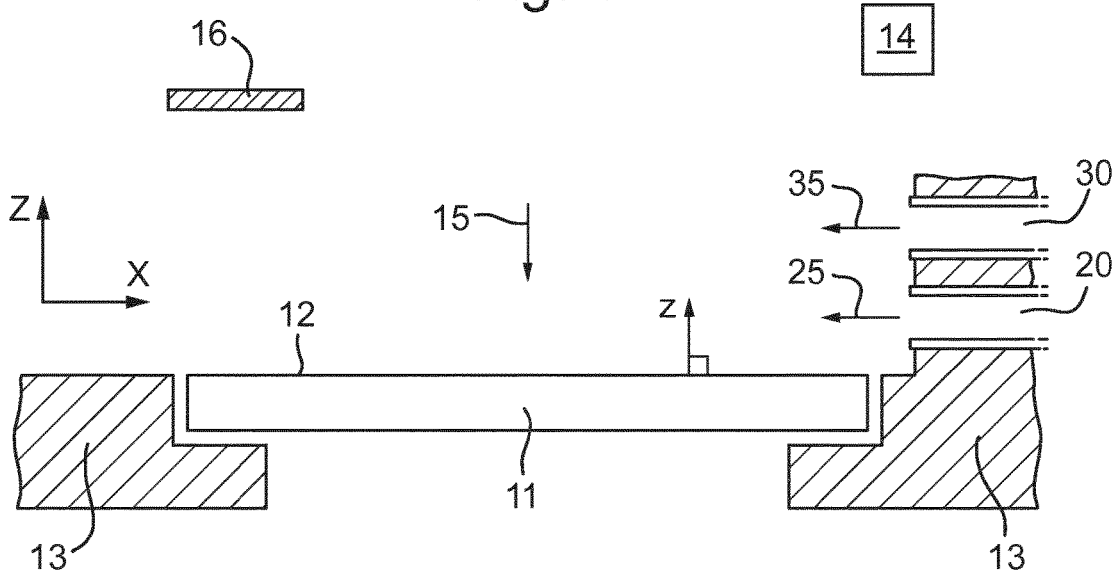
FIG. 4 is a schematic side view illustration of a patterning apparatus according to an embodiment.

In any of the above embodiments, the patterning apparatus 10 may further comprise a gas extractor 16 as depicted in FIG. 4. The gas extractor 16 is configured to extract gas above the patterning device 11, i.e. extract the first gas flow 25 and/or the second gas flow 35. The gas extractor 16 may optionally be included in any of the embodiments. The gas extractor 16 is positioned and configured to receive the first gas flow 25 and the second gas flow 35 that travels across the planar surface 12 of the patterning device 11. The gas extractor 16 may be positioned on substantially an opposite side of the patterning device 11 from the first gas outlet 20 and the second outlet 30 when viewed in plan, e.g. if viewed from above for example. This is shown in side view for example in FIG. 4. The gas extractor 16 may extract the gas as the first gas flow 25 and the second gas flow 35 reaches the opposite side of the patterning device 11 from the first gas outlet 20 and the second gas outlet 30 when viewed in plan, i.e. as the first gas flow 25 and the second gas flow 35 travels from the right side of FIG. 4 to the left side of FIG. 4 which depicts the side view. In some embodiments, extraction of the gas at the gas extractor 16 can be active or passive. The gas extractor 16 may comprise any number of gas inlet openings and may comprise a low pressure system for pulling in gas.

In an embodiment, the speed of gas exiting the first gas outlet 20 and/or the second gas outlet 30 is controlled between approximately 10 m/s to 80 m/s, or desirably between approximately 20 m/s to 60 m/s. In an embodiment the speed of the gas exiting the first gas outlet 20 and/or the second gas outlet 30 is controlled to be less than or equal to approximately 80 m/s, desirably less than or equal to approximately 60 m/s. In an embodiment, the speed of gas exiting the first gas outlet 20 and the second gas outlet 30 is controlled to be greater than or equal to approximately 10 m/s, desirably greater than or equal to approximately 20 m/s.

In an embodiment, the temperature of the gas exiting the first gas outlet 30 and/or the second gas outlet 30 is controlled to between approximately 19° C. to 23° C., desirably between approximately 20.5° C. to 22.5° C., or desirably between approximately 21° C. to 22° C. In an embodiment, the temperature of the gas exiting the first gas outlet 20 and/or the second gas outlet 30 is controlled to be less than or equal to approximately 23° C., desirably less than or equal to approximately 22.5° C., or desirably less than or equal to approximately 22° C. In an embodiment, the temperature of the gas exiting the first gas outlet 20 and/or the second gas outlet 30 is controlled to be greater than or equal to approximately 19° C., desirably greater than or equal to approximately 20.5° C., or desirably greater than or equal to approximately 21° C.

In an embodiment, the gas may be supplied to the first gas outlet 20 and the second gas outlet 30 from a gas source. The gas source (not shown in the Figures) may be the same for the first gas outlet 20 and the second gas outlet 30. Alternatively, the gas may be supplied from a gas supply system (not shown in the Figures) wherein the first gas outlet 20 and the second gas outlet 30 may be provided with gas from different gas sources. Either way, the control system 14 is configured to control the gas exiting the first gas outlet 20 and the gas exiting the second gas outlet 30 to control at the least the momentum of the gas as described above, and optionally the temperature as well, and optionally any other parameter of the gas. The conditioning system may optionally comprise heaters in any of the embodiments, (not shown in figures) in order to control the temperature of gas exiting the first gas outlet 20 and the second gas outlet 30.

In any of the above embodiments, gas exiting the first gas outlet 20 may have a first average velocity at a first angle and gas exiting the second gas outlet 30 may have a second average velocity at a second angle. The first angle and the second angle may be determined with respect to the planar surface 12 of the patterning device 11. In other words the first gas flow 25 and/or the second gas flow 30 may be inclined with respect to the planar surface 12. The average velocity of the gas is determined to have an average speed and an average direction. The angle is determined by the average direction relative to the planar surface 12. The angle of the average velocity of the first gas flow 25 may be a first angle, $\theta_1$. The angle of the second gas flow 35 may be a second angle, $\theta_2$. The first angle $\theta_1$, and the second angle $\theta_2$ may be the same. In some embodiments, the first gas flow 25 from the first gas outlet 20 and/or the second gas flow 35 from the second gas outlet 30 travels substantially parallel to the planar surface 12 of the patterning device 11, as depicted in FIG. 2, i.e. $\theta_1=\theta_2=0$. The first angle $\theta_1$ and the second angle $\theta_2$ may be independently controlled by the control system 14.

Figure 5:
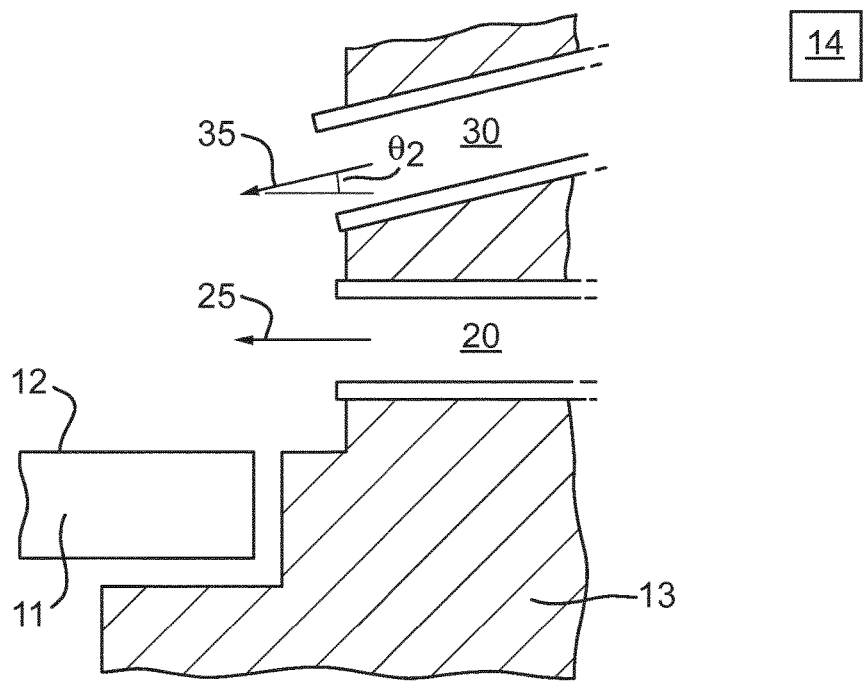
FIG. 5 is a schematic side view illustration of a patterning apparatus according to an embodiment.

An exemplary embodiment is depicted in FIG. 5. The angle could be zero for any gas flow such that the gas flow is parallel to the surface of the planar surface 12 of the patterning device 11. In FIG. 5, the first angle $\theta_1$ is 0 (and thus, is not labelled). However, the direction of the second gas flow 35 (indicating in the direction of the average velocity of the second gas flow 35) is shown to be at a second angle, $\theta_2$, with respect to the planar surface 12 of the patterning device 11. Thus, the first angle $\theta_1$ may be different from the second angle $\theta_2$.

This may be particularly beneficial because different openings may direct the respective gas flows at different downstream locations. For example, as depicted in FIG. 4, the first gas flow 25 from the first gas opening 20 may travel in a direction substantially parallel to the planar surface 12 of the patterning device 11. However, the second gas flow 35 from the second gas outlet 30 has a downward component of direction. Thus, the second gas flow 35 is directed towards the planar surface 12 at the location downstream.

In an embodiment, the first angle $\theta_1$ is different from the second angle $\theta_2$ as described above. In an embodiment, the first angle $\theta_1$ and the second angle $\theta_2$ can be varied. Although the gas outlets are depicted in FIG. 5 as integral with the support structure 13, the gas outlets may instead be attached to, or held by, the support structure 13 and may be moveable with respect to the support structure 13. For example, actuators may be provided to vary the angle of the first gas opening 20 and/or the second gas opening 30 such that the first angle $\theta_1$ and/or the second angle $\theta_2$ can be controlled. In this way, the first angle $\theta_1$ and/or the second angle $\theta_2$ may be varied. The first angle $\theta_1$ and the second angle $\theta_2$ may be controlled independently or each other. The first angle $\theta_1$ and/or the second angle $\theta_2$ may be oscillated to provide gas at a continuously varying angle. For example, the first angle $\theta_1$ and/or the second angle $\theta_2$ may be oscillated between a minimum and maximum angle. The minimum and maximum angle may depend on the distance of the respective outlet from the planar surface 12 i.e. the height in the z direction. For example, the first angle $\theta_1$ and/or the second angle $\theta_2$ may be oscillated between approximately 20° to 70°, although any appropriate value may be used.

In an embodiment, the control system 14 may vary the first momentum of the first gas flow 25 as well as the first angle $\theta_1$. Additionally or alternatively, the control system 14 may vary the second momentum of the second gas flow 35 as well as the second angle $\theta_2$. For example, if the angle is increased to direct gas flow further downstream, the momentum may be increased.

Figure 6A:
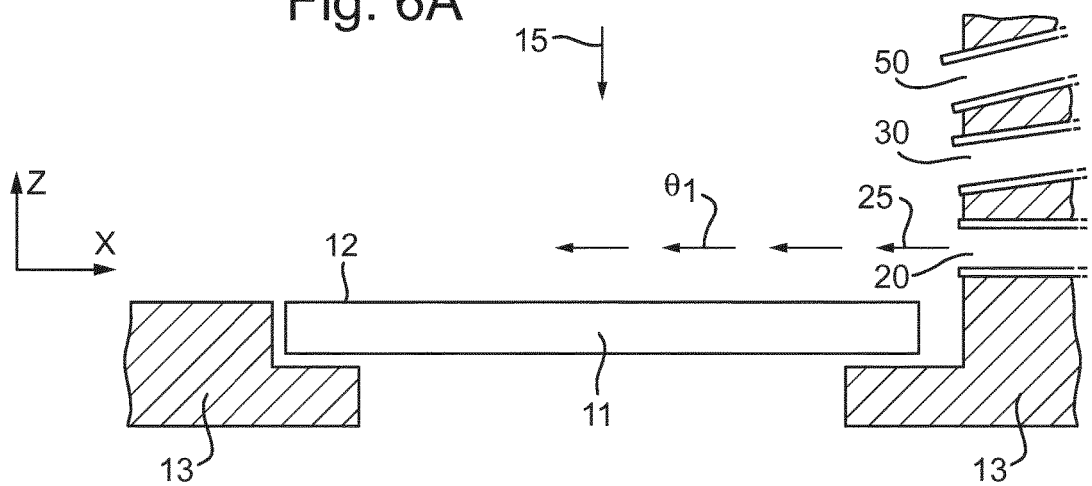
FIGS. 6A, 6B and 6C are schematic side view illustrations of a patterning apparatus according to an embodiment.
Figure 6B:
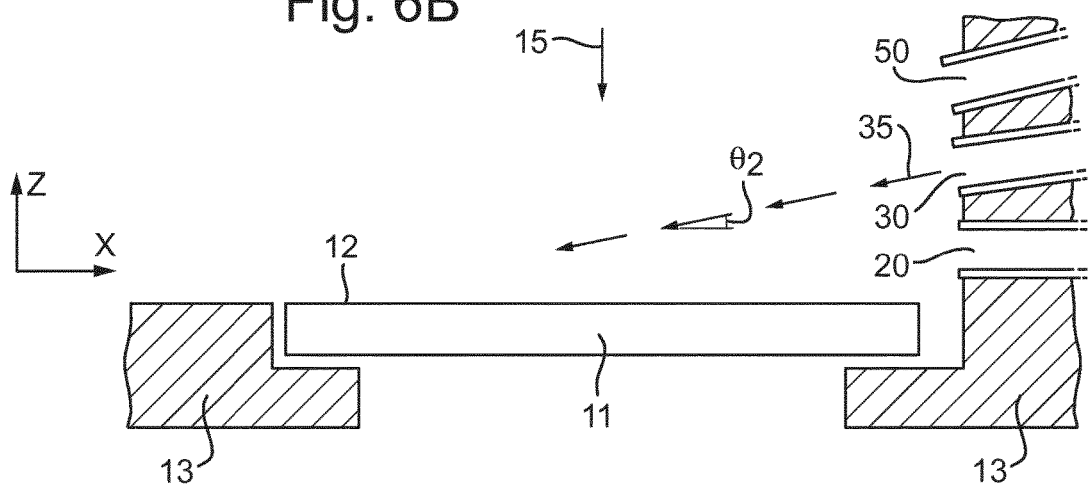
Figure 6C:
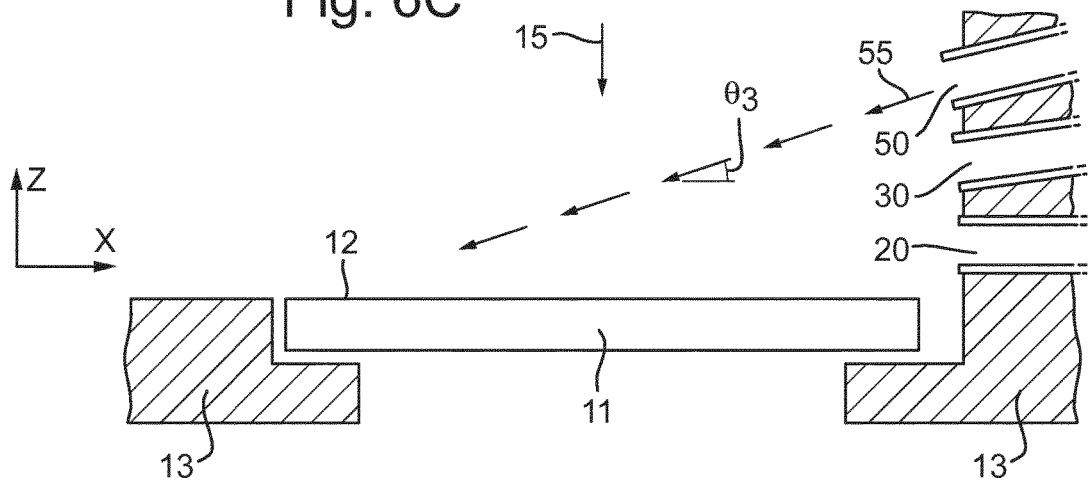

A further exemplary embodiment is depicted in FIGS. 6A, 6B and 6C. These figures depict an embodiment with a third gas outlet 50. The third gas outlet 50 is configured to provide a third gas flow 55. The third gas outlets may be the same as either the first gas outlet 20 and/or the second gas outlet 30 except for any differences described below. Similarly, the third gas flow 55 may be the same as either of the first gas flow 25 or the second gas flow 35 except as described below. As depicted in this embodiment, the first gas flow 25 is provided at a first angle $\theta_1$. A second gas flow 35 is provided with a second angle $\theta_2$. The third gas flow 55 is provided at a third angle $\theta_3$. The angles are determined with respect to the planar surface 12 of the patterning device 11. As is more clearly depicted using three gas outlets, the gas flow is provided from each of the gas outlets onto the same planar surface 12. However, the gas flow over the planar surface 12 from each of the first outlet 20, the second outlet 30, and the third outlet 50 may affect gas over the planar surface 12 in different ways.

For example, the first gas flow 25 may travel substantially parallel to the planar surface 12 of the patterning device, i.e. $\theta_1=0$. However, the second gas flow 35 provided at the second angle, $\theta_2$ is also provided at a greater distance from the planar surface 12 from the first gas outlet 20. Therefore, the second gas flow 35 may reach the planar surface 12 further downstream from the second opening 30 than the first gas flow 25. This is further depicted by the third gas flow 55 provided from the third gas outlet 50. The third gas outlet is arranged at a different distance perpendicular to the planar surface 12 than the first gas outlet 20 and the second gas outlet 30. Thus, the third gas flow 55 may reach the planar surface 12 of the patterning device 11 at a different point downstream from the first gas flow 25 and the second gas flow 35. It will be understood that any of the first angle, $\theta_1$, the second angle, $\theta_2$ and/or the third angle $\theta_3$ may be the same as each other, all these angles may be different from each other, or any combination thereof (e.g., two the same and one different).

Providing gas flows at different perpendicular distances from the planar surface 12 and optionally at one or more different angles with respect to the planar surface 12 means that the flows will have different effects on the flow over the planar surface 12. In this way, the different gas flows from the first outlet 20 and the second outlet 30 as depicted in FIG. 5 or additionally from the first outlet 20, the second outlet 30 and the third outlet 50 can be used to alter the downstream boundary layer which forms over the planar surface 12. The different gas flows can be used to mix flows over the planar surface 12 thus reducing the boundary layer and reducing the heating of the flow over the planar surface 12. As the gas flows can be independently controlled, it is possible to provide one gas flow at a time, for example as depicted in any of FIGS. 6A, 6B and 6C, or multiple gas flows with independently controlled momentums. The various gas flows may be controlled to interact with gas adjacent to the planar surface 12 of the patterning device 11 at different distances downstream of the opening in order to provide more uniform cooling of the patterning device 11.

Similarly, the first angle $\theta_1$, the second angle $\theta_2$ and/or the third angle $\theta_3$ in FIGS. 6A, 6B and 6C may be varied as described for the first angle $\theta_1$ and the second angle $\theta_2$ above.

Although the above description refers to the first gas outlet 20 and the second gas outlet 30, any number of suitable gas outlets may be used. The conditioning system may comprise additional gas outlet(s) to provide a further gas flow(s) over the patterning device 11. Therefore, the conditioning system may comprise any number of additional gas outlets which are controlled separately, i.e. independently, from the other gas outlets. The additional gas outlets may have the same features as described above in relation to the first gas outlet 20 and the second gas outlet 30. These additional gas outlets may be on the same side of the patterning device 11 in plan view as the first gas outlet 20 and the second gas outlet 30. For example, the third gas outlet 50 may be provided as described in relation to FIGS. 6A, 6B and 6C, although further additional gas outlets may be provided also.

Figure 7:
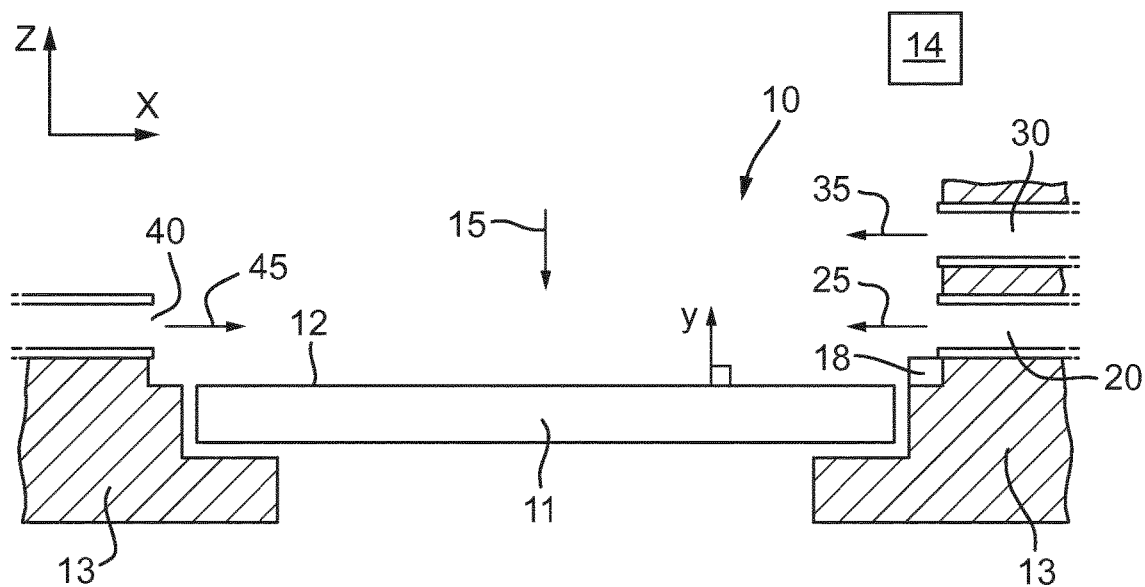
FIG. 7 is a schematic side view illustration of a patterning apparatus according to an embodiment.

In an embodiment, the conditioning system comprises a further gas outlet 40 as depicted in FIG. 7. The further gas outlet 40 is configured to provide a further gas flow 45 over the patterning device 11. The further gas outlet 40 may be similar to the first gas outlet 20, the second gas outlet 30 and/or the third gas outlet 50 as described above, except as described below. The further gas flow 45 may be independently controlled. In the above embodiments depicted in FIGS. 2 to 5, in plan view, the first gas outlet 20 and the second gas outlet 30 may be provided on a same side of the patterning device 11. In other words, the first gas outlet 20 and the second gas outlet 30 may be arranged to provide the first gas flow 25 and the second gas flow 35 respectively from the same side of the patterning device 11 in plan view. This plan view is depicted in FIG. 3. In an embodiment, the further gas outlet 40 is arranged on another side of the patterning device 11 in plan view, e.g., the opposite side of the patterning device 11. Therefore, the further gas outlet 40 provides the further gas flow 45 to the same planar surface 12 of the patterning device 11. However, for example, the further gas outlet 40 is arranged along a different edge of the patterning device 11 than the first gas outlet 20 and the second gas outlet 30.

The further gas outlet 40 provides a further separately controlled gas flow 45 over the planar surface 12 of the patterning device 11. In this embodiment, the control system 14 is configured further to control independently at least one parameter of the gas exiting the further gas outlet 40. In other words, the control system 14 is configured to control at least the one parameter of gas exiting the further gas outlet 40 separately from controlling gas exiting either of the first gas outlet 20 and the second gas outlet 30. The control system 14 may be configured to control the momentum of the gas exiting the further gas outlet 40. The control system 14 may control the momentum of the gas exiting the further gas outlet 40 such that the momentum of the gas exiting the further gas outlet 40 is substantially the same as the momentum of the gas exiting the first gas outlet 20 and/or the second gas outlet 30. The control system 14 may be configured to control the momentum of the gas exiting the first gas outlet 20, the second gas outlet 30 and the further gas outlet 40 such that the speed of the gas over the patterning device 11 is substantially uniform from either side of the patterning apparatus 10. In an embodiment, the controller 14 may alternatively or additionally control a different parameter of the further gas flow 45 for example, the temperature and/or the gas humidity.

Providing a gas flow from or to the opposite side of the patterning device 11 which is separately controlled is beneficial because it provides more control of the temperature of the patterning device 11. The further gas outlet 40 may provide additional gas flow which may increase cooling of patterning device 11. On the opposite side of the patterning device 11 (i.e. downstream from the first gas outlet 20 and the second gas outlet 30) the gas may be heated and have less effect on the temperature of the patterning device 11. Therefore, for example, providing the further gas outlet 40 located opposite the first gas outlet 20 and the second gas outlet 30 means that gas is provided to an area of the planar surface 12 of the patterning device 11 which may not be effectively cooled by the first gas flow 25 and the second gas flow 35.

Furthermore, providing a further gas flow 45 from an opposite side of the patterning device 11 (in plan view) may lead to a stagnation zone to develop over the planar surface 12 of the patterning device 11. The stagnation zone may be an area where the gas flows meet and where the speed of the gas is reduced, and is possibly zero, due to interaction of different gas flows. The stagnation zone may reduce the efficiency of providing a further gas outlet 40 on the opposite side to the first gas outlet 20 and the second gas outlet 30. However, independently controlling the momentum of gas exiting the further gas outlet 40 means that the momentum can be changed (or it may stay the same while the momentum of the first gas flow 25 and/or the second gas flow 35 is changed). Changes of any of the first gas flow 25, second gas flow 35 and/or the third gas flow 45 with respect to one another may move the location of the stagnation zone. This means the stagnation zone may be moved to different locations on the planar surface 12 of the patterning device 11 to allow better control of the temperature of the patterning device 11.

Figure 8:
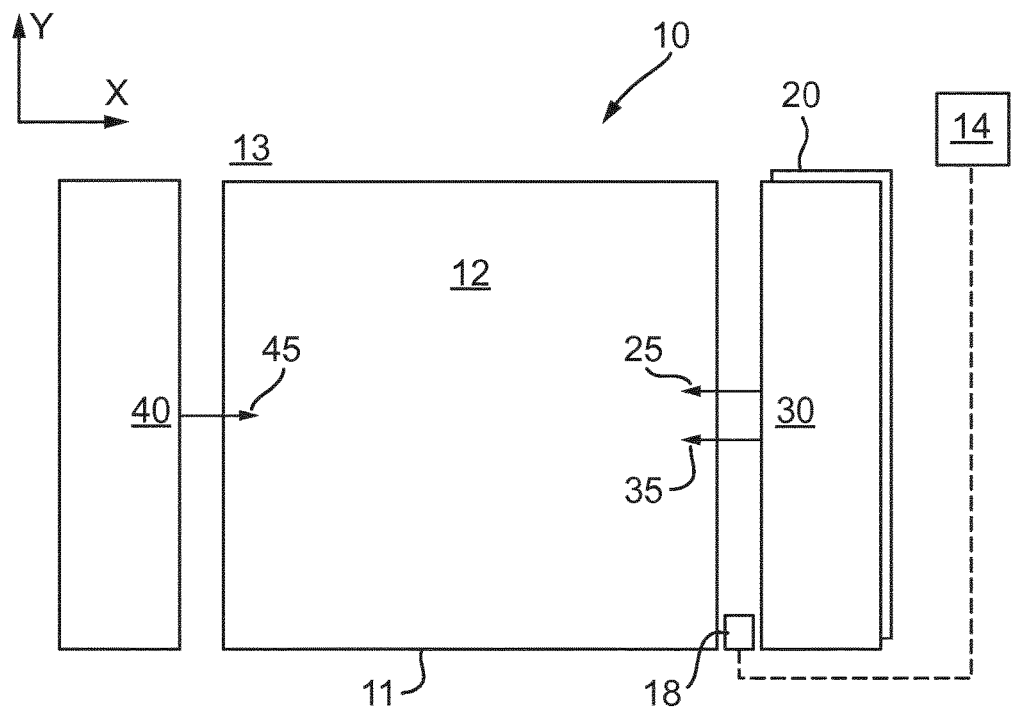
FIG. 8 is a schematic plan view illustration of the patterning apparatus depicted in FIG. 7.

Although the further gas outlet 50 is depicted in FIGS. 7 and 8 with only the first gas outlet 20 and the second gas outlet 30, a third gas outlet 50 as described above may also be provided on the same side in plan view as the first gas outlet 20 and the second gas outlet 30. Furthermore, additional gas outlets may be provided on the same side in plan view as the further gas outlet 40. The additional gas outlets may be provided at a different perpendicular distance from the planar surface 12 than the further gas outlet 40.

In any of the above embodiments, the control system 14 may be configured to control the temperature of gas exiting each of the first gas outlet 20 and/or the second gas outlet 30 and/or, where appropriate the third gas outlet 50 and/or the further gas outlet 40 at a certain or predetermined temperature. The temperature may be based on a predicted downstream temperature profile. In an embodiment, the temperature may be set at an optimum value determined for the first gas outlet 20, and/or the second gas outlet 30, and/or, where appropriate the third gas outlet 50 and/or the further gas outlet 40. The temperature may be set depending on the radiation beam 15 incident on the patterning device 11, for example, depending on the intensity of the radiation beam 15 across the patterning device 11.

In any of the above embodiments, the temperature of gas exiting at least one of the gas outlets may be dynamically controlled. For example, the patterning apparatus 10 may comprise a sensor system comprising at least one sensor, for example, a sensor 18 as depicted in FIGS. 7 and 8. The sensor 18 may optionally be provided with the embodiment depicted in FIGS. 7 and 8, and/or it may optionally be provided with any other embodiment, such as those depicted in FIGS. 2 to 6C. The sensor 18 may be used to determine a characteristic of the patterning apparatus 10. For example, the sensor 18 may be used to measure the temperature of gas surrounding the sensor 18. The measurement made by the sensor 18 may be sent to the control system 14. The control system 14 may be configured to use the measurement from the sensor 14 to dynamically control gas exiting the at least one of the gas outlets, for example, by adjusting if necessary the temperature of gas exiting one or more selected from: the first gas outlet 20, and/or the second gas outlet 30, and/or, where appropriate the third gas outlet 50 and/or the further gas outlet 40.

The above embodiments are depicted and described in respect of the planar surface 12 of the patterning device 11 on which the radiation beam 15 is incident. This planar surface 12 may be described as a top surface, however the orientation of the patterning apparatus 10 could be changed such that the planar surface 12 is no longer at the top. The first gas outlet 20, the second gas outlet 30, the third gas outlet 50 and/or the further gas outlet 40 may be above the planar surface 12. However, the conditioning system may be applied to a different surface, for example, the other side of the patterning device 11 from a side view. This other surface may in fact be the bottom surface of the patterning device 14. Alternatively, even when the radiation beam 15 is provided on one side of the patterning apparatus 10, the gas outlets as described in any of the above embodiments may be provided and controlled on surfaces on the other side of the patterning apparatus 10 in side view. For example, if the radiation beam 15 was incident on a top surface, the gas outlets may provide a gas flow over the bottom surface.

In some embodiments, the patterning apparatus 10 can be used in a lithographic apparatus 100 or 100' as described above with reference to FIGS. 1A and 1B. For example, the patterning apparatus 10 may be used in conjunction with lithographic apparatus 100 or 100' which includes an illuminator IL that is configured to condition a radiation beam B discussed in FIGS. 1A and 1B above.

In an embodiment, there is provided a device manufacturing method may be provided. The method may comprise: projecting a beam through a patterning device, wherein the beam is patterned by the patterning device; independently varying a first gas flow over a planar surface of the patterning device in use from a first gas outlet and/or a second gas flow over the planar surface of the patterning device in use from a second gas outlet, wherein the first gas outlet and the second gas outlet are at different distances perpendicular to from the planar surface of the patterning device; and directing the beam onto a substrate. The method may use a patterning apparatus 10 as described in any of the above embodiments.

In an embodiment, there is provided a patterning apparatus for a lithographic apparatus, comprising: a patterning device support structure configured to support a patterning device having a planar surface; a patterning device conditioning system comprising a first gas outlet configured to provide a first gas flow over the planar surface in use and a second gas outlet configured to provide a second gas flow over the planar surface in use, wherein the first gas outlet and the second gas outlet are arranged at different distances perpendicular to the planar surface; and a control system configured to independently control a first momentum of gas exiting the first gas outlet and a second momentum of gas exiting the second gas outlet.

In an embodiment, the first momentum is different from the second momentum. In an embodiment, the patterning device conditioning system is configured to provide gas exiting the first gas outlet and the second gas outlet simultaneously. In an embodiment, the patterning device conditioning system is configured to provide gas from the first gas outlet and gas from the second gas outlet at different times from each other. In an embodiment, an average velocity of gas exiting the first gas outlet is at a first angle with respect to the planar surface and an average velocity of gas exiting the second gas outlet is at a second angle with respect to the planar surface of the patterning device. In an embodiment, the first angle is different from the second angle. In an embodiment, the control system is configured to control the first angle and/or the second angle. In an embodiment, the patterning apparatus comprises a further gas outlet configured to provide a further gas flow over the planar surface, wherein at least the first gas outlet and the second gas outlet are provided on a same side of the patterning device in plan view and the further gas outlet is arranged on another side of the patterning device in plan view, the further gas outlet configured to provide the further gas flow in a substantially opposite direction to gas exiting the first gas outlet and/or the second gas outlet. In an embodiment, the further momentum of the gas exiting the further gas outlet is independently controlled.

In an embodiment, there is provided a lithographic apparatus comprising a patterning apparatus as described herein.

In an embodiment, there is provided a device manufacturing method using a lithographic apparatus, the method comprising: projecting a beam through a patterning device, wherein the beam is patterned by the patterning device;

independently varying a first gas flow over a planar surface of the patterning device in use from a first gas outlet and/or a second gas flow over the planar surface of the patterning device in use from a second gas outlet, wherein the first gas outlet and the second gas outlet are at different distances perpendicular to the planar surface of the patterning device; and directing the patterned beam onto a substrate.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein generally describes a material onto which subsequent material layers are added. In embodiments, the substrate itself may be patterned and materials added on top of it may also be patterned, or may remain without patterning.

In the embodiments described herein, the terms "lens", where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Although specific reference can be made in this text to the use of lithographic apparatus in the manufacture of ICs, it should be understood that the patterning apparatus and lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The embodiment(s) described, and references in the specification to "an example," "one embodiment," "an embodiment," "an example embodiment," "some embodiments," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While specific embodiments have been described above, it will be appreciated that the embodiments may be practiced otherwise than as described. The description is intended to be illustrative and not intended to limit the invention. Thus, it will be apparent to one skilled in the art that modifications may be made to the present invention as described without departing from the scope of the claims set out below.

The Summary and Abstract sections may set forth one or more but not all exemplary embodiments as contemplated by the inventor(s), and thus, are not intended to limit the present invention as claimed.

The disclosed embodiment(s) merely exemplify the invention. The breadth and scope of the present invention should not be limited by any of the above-described exemplary embodiments, but should be defined only in accordance with the following claims and their equivalents.

The invention claimed is:

1. A patterning apparatus for a lithographic apparatus, the patterning apparatus comprising:
a patterning device support structure configured to support a patterning device having a planar surface;
a patterning device conditioning system comprising a first gas outlet configured to provide a first gas flow over the planar surface in use with a directional component parallel to the planar surface and a second gas outlet configured to provide a second gas flow over the planar surface in use with a directional component parallel to the planar surface, wherein the first gas outlet and the second gas outlet are arranged at different distances perpendicular to the planar surface and the first and second gas outlets are arranged to provide their respective gas flows to be in contact with the planar surface in use; and a control system configured to independently control a first momentum of gas exiting the first gas outlet and a second momentum of gas exiting the second gas outlet such that the first momentum is different from the second momentum.

2. The patterning apparatus of claim 1, wherein the patterning device conditioning system is configured to provide gas exiting the first gas outlet and the second gas outlet simultaneously.

3. The patterning apparatus of claim 1, wherein the patterning device conditioning system is configured to provide gas from the first gas outlet and gas from the second gas outlet at different times from each other.

4. The patterning apparatus of claim 1, wherein an average velocity of gas exiting the first gas outlet is at a first angle with respect to the planar surface and an average velocity of gas exiting the second gas outlet is at a second angle with respect to the planar surface of the patterning device.

5. The patterning apparatus of claim 4, wherein the first angle is different from the second angle.

6. The patterning apparatus of claim 4, wherein the control system is configured to control the first angle and/or the second angle.

7. The patterning apparatus of claim 1, comprising a further gas outlet configured to provide a further gas flow over the planar surface, wherein at least the first gas outlet and the second gas outlet are provided on a same side of the patterning device in plan view and the further gas outlet is arranged on another side of the patterning device in plan view, the further gas outlet configured to provide the further gas flow with a directional component in a substantially opposite direction to the directional component of the gas exiting the first gas outlet and/or the second gas outlet.

8. The patterning apparatus of claim 7, wherein the further momentum of the gas exiting the further gas outlet is independently controlled.

9. A lithographic apparatus comprising the patterning apparatus of claim 1.

10. The patterning apparatus of claim 1, comprising a further gas outlet configured to provide a further gas flow over the planar surface, the further gas outlet at a different distance perpendicular to the planar surface of the patterning device than the first and second gas outlets.

11. The patterning apparatus of claim 1, wherein at least the first gas outlet and the second gas outlet are provided on a same side of the patterning device in plan view.

12. A device manufacturing method using a lithographic apparatus, the method comprising:

projecting a beam through a patterning device, wherein the beam is patterned by the patterning device;

independently varying a first momentum of a first gas flow over a planar surface of the patterning device in use from a first gas outlet and a second momentum of a second gas flow over the planar surface of the patterning device in use from a second gas outlet such that the first momentum is different from the second momentum, wherein the first gas outlet and the second gas outlet are at different distances perpendicular to the planar surface of the patterning device, wherein the first and second gas outlets are arranged to provide their respective gas flows to be in contact with the planar surface in use, and wherein each of the first and second gas flows has a directional component parallel to the planar surface; and directing the patterned beam onto a substrate.

13. The method of claim 12, wherein gas exits the first gas outlet and the second gas outlet simultaneously.

14. The method of claim 12, wherein an average velocity of gas exiting the first gas outlet is at a first angle with respect to the planar surface and an average velocity of gas exiting the second gas outlet is at a second angle with respect to the planar surface of the patterning device.

15. The method of claim 14, wherein the first angle is different from the second angle.

16. The method of claim 14, further comprising varying the first angle and/or the second angle.

17. The method of claim 12, further comprising providing a further gas flow over the planar surface from a further gas outlet, wherein at least the first gas outlet and the second gas outlet are provided on a same side of the patterning device in plan view and the further gas outlet is arranged on another side of the patterning device in plan view, the further gas outlet configured to provide the further gas flow in a substantially opposite direction to gas exiting the first gas outlet and/or the second gas outlet.

18. The method of claim 17, wherein the further momentum of the gas exiting the further gas outlet is independently controlled from the gas from the first gas outlet and/or the second gas outlet.

19. The method of claim 12, further comprising providing a further gas flow over the planar surface from a further gas outlet, wherein the further gas outlet is at a different distance perpendicular to the planar surface of the patterning device than the first and second gas outlets.

20. The method of claim 12, wherein at least the first gas outlet and the second gas outlet are provided on a same side of the patterning device in plan view.

21. The method of claim 12, wherein gas exits from the first gas outlet and exits from the second gas outlet at different times from each other.

* * * * *